(12) United States Patent
Das et al.

(10) Patent No.: US 9,997,242 B2
(45) Date of Patent: Jun. 12, 2018

(54) METHOD, SYSTEM AND DEVICE FOR NON-VOLATILE MEMORY DEVICE STATE DETECTION

(71) Applicant: ARM Ltd., Cambridge (GB)

(72) Inventors: Shidhartha Das, Upper Cambourne (GB); Mudit Bhargava, Austin, TX (US); Glen Arnold Rosendale, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days. days.

(21) Appl. No.: 15/294,359

(22) Filed: Oct. 14, 2016

(65) Prior Publication Data

US 2018/0108402 A1    Apr. 19, 2018

(51) Int. Cl.
  *G11C 11/00* (2006.01)
  *G11C 13/00* (2006.01)

(52) U.S. Cl.
  CPC ........ *G11C 13/004* (2013.01); *G11C 13/0069* (2013.01)

(58) Field of Classification Search
  CPC ............................ G11C 13/004; G11C 13/0069
  USPC ........................................ 365/148, 174, 207
  See application file for complete search history.

(56) References Cited

U.S. PATENT DOCUMENTS

| | | | |
|---|---|---|---|
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 8,279,677 B1 * | 10/2012 | Raghavan | G11C 11/5642 365/185.18 |
| 8,773,887 B1 | 7/2014 | Naji | |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 2002/0018369 A1 * | 2/2002 | Ogura | G11C 16/26 365/185.21 |
| 2006/0158926 A1 * | 7/2006 | Yokoyama | H01L 27/1104 365/154 |
| 2007/0019469 A1 * | 1/2007 | Motoki | G11C 7/062 365/185.03 |
| 2008/0106926 A1 * | 5/2008 | Brubaker | H01L 27/2409 365/148 |
| 2008/0107801 A1 | 5/2008 | Celinska et al. | |
| 2009/0231083 A1 * | 9/2009 | Hosoi | G11C 13/0007 338/20 |
| 2013/0200323 A1 | 8/2013 | Pham et al. | |

(Continued)

FOREIGN PATENT DOCUMENTS

WO    2009114796 A1    9/2009

OTHER PUBLICATIONS

Invitation to Pay Additional Fees and, where applicable, Protest Fees, dated Jan. 8, 2018, International Application No. PCT/GB2017/053089, 14 pgs.

(Continued)

*Primary Examiner* — Vu Le
(74) *Attorney, Agent, or Firm* — Berkeley Law & Technology Group, LLP

(57) ABSTRACT

Disclosed are methods, systems and devices for operation of non-volatile memory devices. In one aspect, a sense circuit may enable a determination of a current impedance state of a non-volatile memory element while avoiding an unintentional change in the state of the non-volatile memory element.

14 Claims, 10 Drawing Sheets

(56) References Cited

U.S. PATENT DOCUMENTS

2013/0214232 A1   8/2013   Tendulkar
2013/0285699 A1   10/2013   McWilliams et al.
2017/0033782 A1   2/2017   Shifren et al.
2017/0045905 A1   2/2017   Sandhu et al.
2017/0047116 A1   2/2017   Sandhu et al.
2017/0047919 A1   2/2017   Sandhu et al.
2017/0069378 A1   3/2017   Shifren et al.

OTHER PUBLICATIONS

Notification of Transmittal of the International Search Report and The Written Opinion of the International Searching Authority, or the Declaration, dated Feb. 26, 2018, International Application No. PCT/GB2017/05309, 1 pg.
The International Search Report, dated Feb. 26, 2018, International Application No. PCT/GB2017/05309, 6 pgs.
The Written Opinion of the International Searching Authority, dated Feb. 26, 2018, International Application No. PCT/GB2017/05309, 13 pgs.

\* cited by examiner

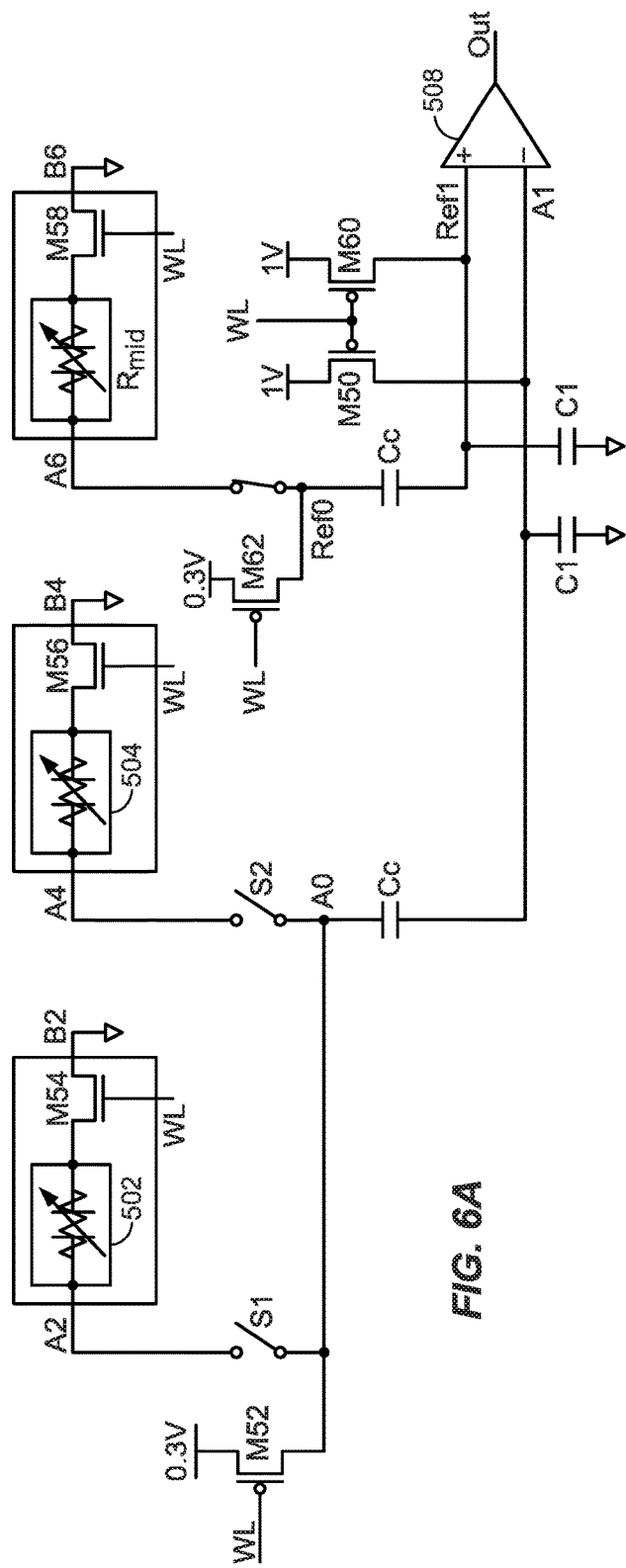
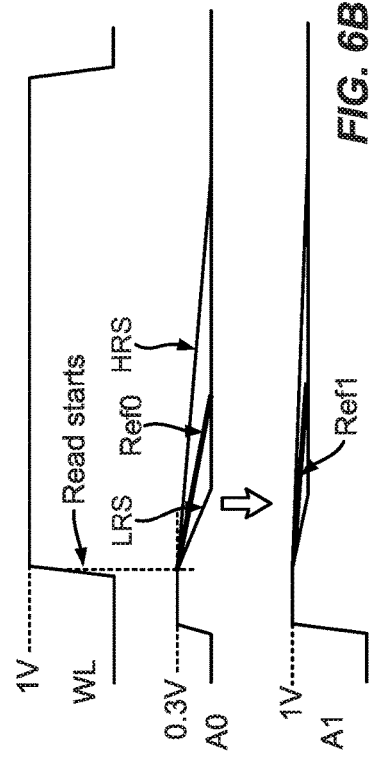
FIG. 6A
FIG. 6B

METHOD, SYSTEM AND DEVICE FOR NON-VOLATILE MEMORY DEVICE STATE DETECTION

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\epsilon$, with x, y, z and ε of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments are still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

Given an inherent difficulty in forming a thin film resistance switching material that is stable over time and temperature, a workable resistance switching memory remains a challenge. Furthermore, all resistance switching mechanisms developed up to now have been inherently unsuitable for memories, due to high currents, electroforming, no measurable memory read or write windows over a reasonable range of temperatures and voltages, and many other problems such as stochastic behavior. Thus, there remains a need in the art for a non-volatile memory that is deterministic has low power, high speed, high density and stability, and in particular, such a memory that is scalable to feature sizes well below 65 nanometers (nm).

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may be best understood by reference to the following detailed description if read with the accompanying drawings in which:

FIG. 6A is schematic diagram of a circuit for applying a read operation to a non-volatile memory element according to an alternative embodiment;

FIG. 6B is a timing diagram of a read operation according to an embodiment;

Figure 1A:
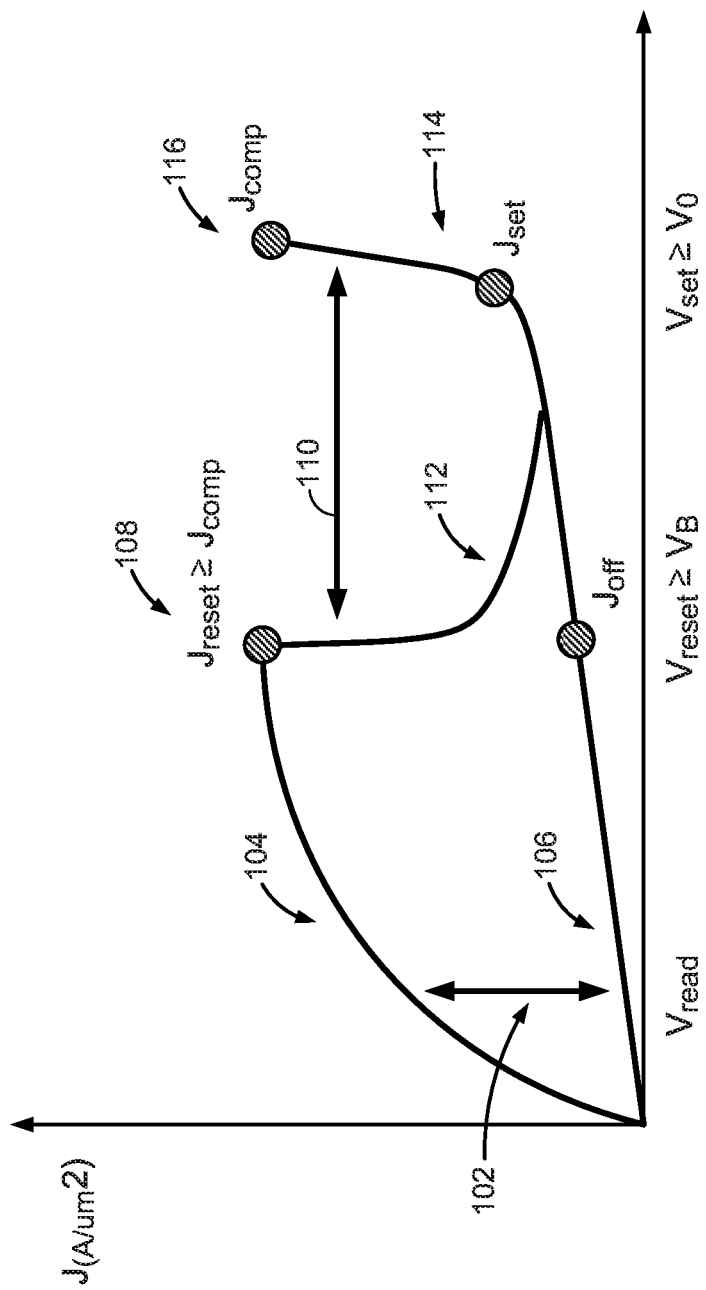
FIG. 1A shows a plot of current density versus voltage for a CES device according to an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

Particular aspects of the present disclosure incorporate a Correlated Electron Material (CEM) to form a correlated electron switch (CES). In this context, a CES may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES between an insulative state and a conductive state may be understood in terms of a Mott transition. In a Mott transition, a material may switch from an insulative state to conductive state if a Mott transition condition occurs. The criteria may be defined by the condition $(n_C)^{1/3} a = 0.26$, where $n_C$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES device; a write circuit for placing the resistive switching memory cell in a first resistive state or a second resistive state depending on signals provided to the memory cell, wherein a resistance of the CES is higher in the second resistance state than in the first resistance state; and a read circuit for sensing the state of the memory cell and providing an electrical signal corresponding to the sensed state of the memory cell. In one aspect, a resistance of a CES in the second memory cell state may be more than 100 times the resistance in the second memory cell state. In a particular implementation, a CES device may switch resistive states responsive to a Mott-transition in a majority of the volume of the CES device. In one aspect, a CES device may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES device may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on detection of a signal in a "read operation." In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. A "programming signal" as referred to herein means a condition applied across terminals of a device to affect a physical state such as in a write operation. In one example implementation, a programming signal may comprise a current and a voltage applied across terminals of a device to place the device in a particular impedance state. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1A shows a plot of current density versus voltage across terminals (not shown) for a CES device according to an embodiment. Based, at least in part, on a voltage applied to terminals of the CES device (e.g., in a write operation), the CES may be placed in a conductive state or an insulative state. For example application of a voltage $V_{set}$ and current density $J_{set}$ may place the CES device in a low impedance or conductive memory state and application of a voltage $V_{reset}$ and a current density $J_{reset}$ may place the CES device in a high impedance or insulative memory state. Following placement of the CES in an insulative state or conductive memory state, the particular state of the CES device may be detected by application of a voltage $V_{read}$ (e.g., in a read operation) and detection of a current or current density at terminals of the CeRAM device.

According to an embodiment, the CES device of FIG. 1A may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from claimed subject matter.

In one aspect, the CES device of FIG. 1A may comprise materials that are TMO metal oxide variable resistance materials, though it should be understood that these are exemplary only, and are not intended to limit claimed subject matter. Particular implementations may employ other variable impedance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO($C_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO($L_x$), where $L_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES device may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES device is still in the insulative state, current may generated by transportation of electron holes. If enough bias is applied across terminals of the CES, electrons may be injected into a metal-insulator-metal (MIM) diode over the potential barrier of the MIM device. If enough electrons have been injected and enough potential is applied across terminals to place the CES device in a set state, an increase in electrons may screen electrons and remove a localization of electrons, which may collapse the band-splitting potential forming a metal.

According to an embodiment, current in a CES device may be controlled by an externally applied "compliance" condition determined based, at least in part, on the external current limited during a write operation a write operation to place the CES device in a conductive state. This externally applied compliance current may also set a condition of a current density for a subsequent reset operation to place the CES in an insulative state. As shown in the particular implementation of FIG. 1A, a current density $J_{comp}$ applied during a write operation at point 116 to place the CES device in an conductive state may determine a compliance condition for placing the CES device in an insulative state in a subsequent write operation. As shown, the CES device may be subsequently placed in a conductive state by application of a current density $J_{reset} \geq J_{comp}$ at a voltage $V_{reset}$ at point 108, where $J_{comp}$ is externally applied.

The compliance condition therefore may determine a number of electrons in a CES device which are to be "captured" by holes for the Mott transition. In other words, a current applied in a write operation to place a CES device in a conductive memory state may determine a number of holes to be injected to the CES device for subsequently transitioning the CES device to an insulative memory state.

As pointed out above, a reset condition may occur in response to a Mott transition at point 108. As pointed out above, such a Mott transition may occur at condition in a CES device in which a concentration of electrons n equals a concentration of electron holes p. This condition may be modeled according to expression (1) as follows:

$$\lambda_{TF} n^{\frac{1}{3}} = C \sim 0.26 \quad (1)$$

$$n = \left(\frac{C}{\lambda_{TF}}\right)^3$$

where:
$\Lambda_{TF}$ is a Thomas Fermi screening length; and
C is a constant.

According to an embodiment, a current or current density in a region 104 of the plot shown in FIG. 1A may exist in response to injection of holes from a voltage signal applied across terminals of a CES device. Here, injection of holes may meet a Mott transition criterion for the conductive state to insulative state transition at current $I_{MI}$ as a critical voltage $V_{MI}$ is applied across terminals of CES device. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

Where $Q(V_{MI})$ is the charged injected (hole or electron) and is a function of an applied voltage.

Injection of electron holes to enable a Mott transition may occur between bands and in response to critical voltage $V_{MI}$. and critical current $I_{MI}$. By equating electron concentration n with a charge concentration to bring about a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CeRam}} = \frac{q}{A_{CeRam}t}\left(\frac{C}{\lambda_{TF}(V_{MI})}\right)^3$$

Where:
$A_{CeRam}$ is a cross-sectional area of a CES element; and
$J_{reset}(V_{MI})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and closing the bandgap. A current density $J_{set}(V_{MI})$ for transitioning the CES to the conductive memory state at a critical voltage $V_{MI}$ enabling transition to the conductive memory state may be expressed according to expression (4) as follows:

$$I_{MI}(V_{MI}) = \frac{dQ(V_{MI})}{dt} \approx \frac{Q(V_{MI})}{t}$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{MI}) = J_{injection}(V_{MI}) = J_{MI}(V_{MI}) = \frac{I_{MI}(V_{MI})}{A_{CeRam}} = \frac{q}{A_{CeRam}t}\left(\frac{C}{a_B}\right)^3$$

where:
AB is a Bohr radius.

According to an embodiment, a "read window" 102 for detecting a memory state of a CES device in a read operation may be set out as a difference between a portion 106 the plot of FIG. 1A while the CES device is in an insulative state and a portion 104 of the plot FIG. 1A while the CES device is in a conductive state at a read voltage $V_{read}$. In a particular implementation, read window 102 may be used to determine a Thomas Fermi screening length $\lambda_{TF}$ of material making up the CES device. For example, at a voltage $V_{reset}$, current densities $J_{reset}$ and $J_{set}$ may be related to according to expression (5) as follows:

$$\lambda_{TF}(@V_{reset}) = a_B\left(\frac{J_{resset}}{J_{off}}\right)^{\frac{1}{3}} \quad (5)$$

In another embodiment, a "write window" 110 for placing a CES device in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 110 may be determined, at least in part, by materials and doping of the CES device.

Figure 1B:
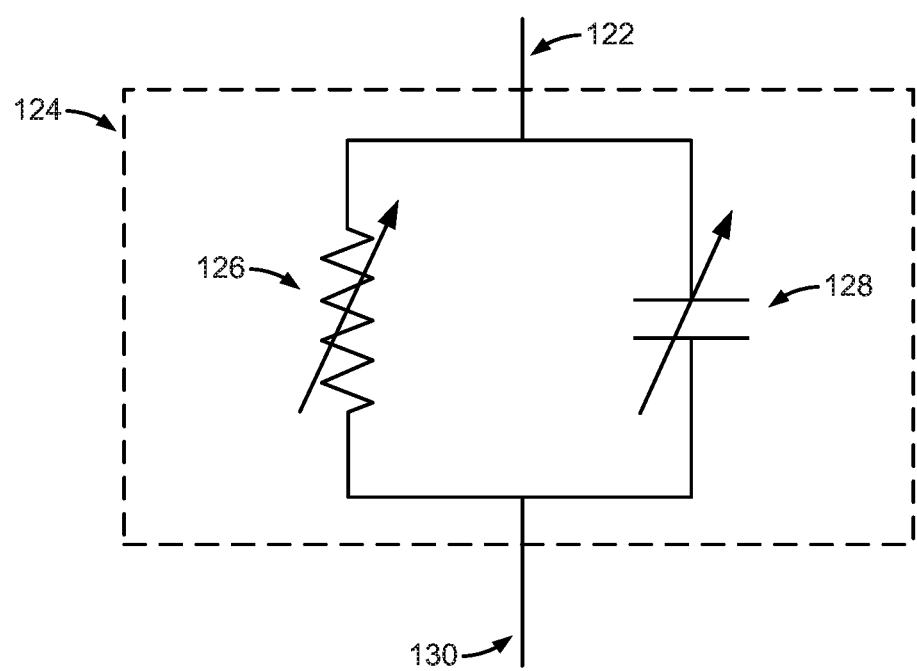
FIG. 1B is a schematic diagram of an equivalent circuit to a CES device according to an embodiment.

The transition from high resistance/capacitance to low resistance/capacitance in a CES device may be represented by a singular impedance of the CES device. FIG. 1B depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM, wherein the CEM comprises characteristics of variable capacitance and variable resistance. Table 1 below depicts an example truth table for an example variable impeder device, such as variable impeder device 100.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

According to an embodiment, a read operation for detecting a state of a CES device as being in a low impedance or conductive state, or in a high impedance or insulative state may comprise measuring a signal during application of a particular voltage across terminals of the CES. In one example as illustrated above in FIG. 1A, a voltage $V_{read}$ may be applied across terminals of the CES. According to an embodiment, the state of the CES device may be detected based, at least in part, on a magnitude of a current or current density in the CES while voltage $V_{read}$ is applied. In an example implementation of a read operation, a voltage $V_{read}$ may be applied to terminals of the CES from a precharged bitline. A larger value of $V_{read}$ applied during a read operation may enable reliable detection of the state of the CES based on the magnitude of the current or current density in the presence of noise. However, it may be desirable to limit $V_{read}$ during read operations to be less than $V_{reset}$ so as to avoid an unintended reset operation placing the CES device in a high impedance or insulative state.

Schemes for detecting an impedance state of a non-volatile memory element may include complex timing circuitry to avoid aliasing arising from a complete discharge of a bitline regardless of the particular impedance state of the non-volatile memory element. As discussed below, a load element formed between a voltage source and a terminal of a non-volatile memory element may form a resistive ladder. Here, a voltage on the bitline may be sensed to determine the particular impedance state of the non-volatile memory element. In this context, a "voltage source" as referred to herein means a device to apply a signal to a node, conductor, terminal, load, etc., that is maintained at a particular voltage level. In one example, a voltage source may maintain an applied signal at a static voltage level such that the voltage level does not change significantly over time. In another example, a voltage source may maintain an applied signal as an oscillating signal or a signal that varies over time according to some other profile.

Figure 2:
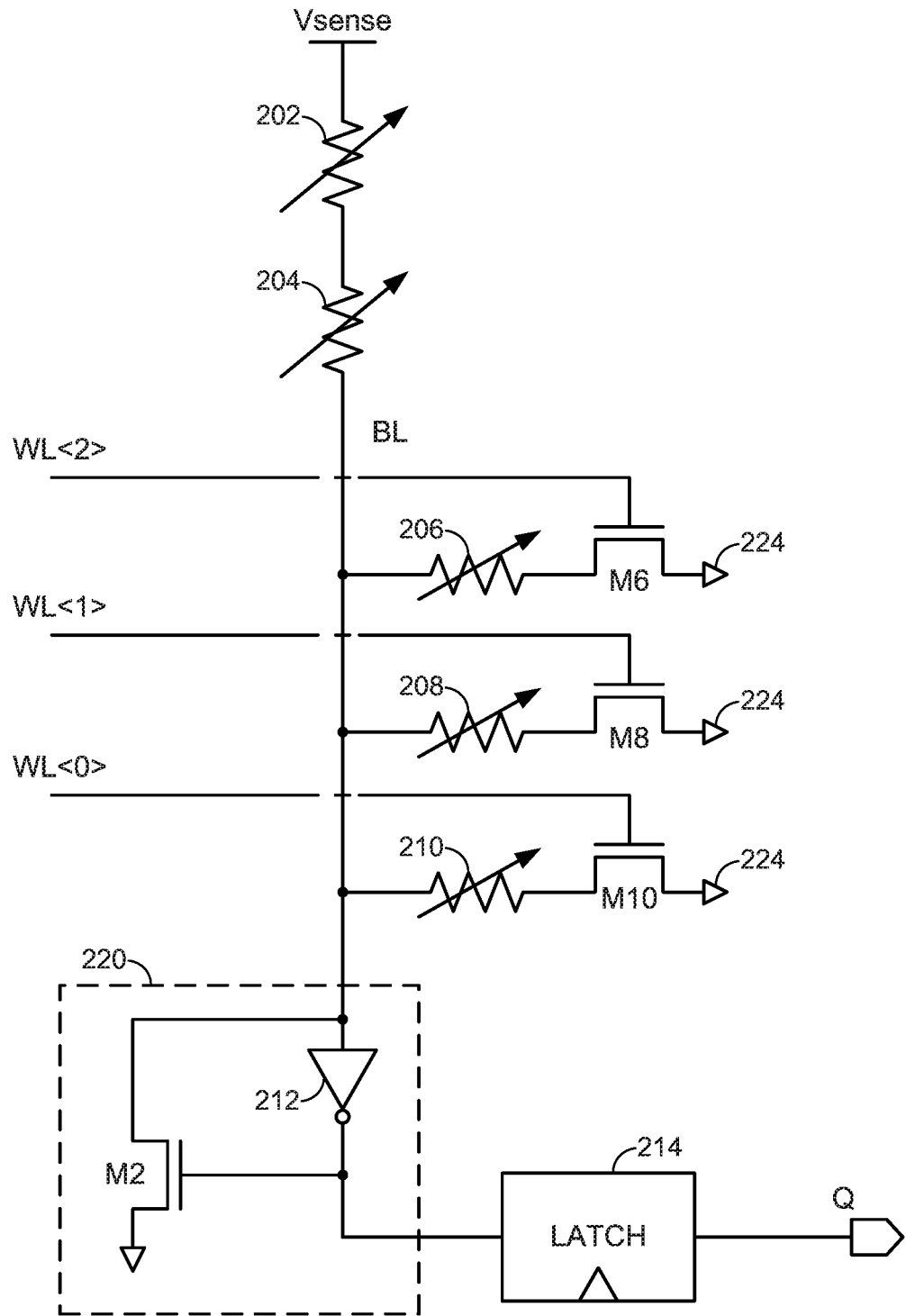
FIG. 2 is schematic diagram of a circuit for applying read operations to a non-volatile memory element according to an embodiment.

FIG. 2 is a schematic diagram of a circuit for performing a read operation on a non-volatile memory device selected from among non-volatile memory devices 206, 208 and 210. In a particular implementation, non-volatile memory devices 206, 208 and 210 are formed as CES elements such as CeRAM elements. However, non-volatile memory devices 206, 208 and 210 may be formed from materials other than correlated electron materials and using different technologies, and claimed subject matter is not limited in this respect. Also, for simplicity of illustration, FIG. 2 only shows three selectable non-volatile memory elements. It should be understood that the features illustrated and described may be implemented in other embodiments in larger arrays including more wordlines and multiple selectable non-volatile memory elements per wordline (e.g., in selectable bitcells).

Each of the non-voltage memory devices 206, 208 and 210 are shown as comprising a first terminal coupled to a bitline BL and a second terminal coupled to a corresponding conducting element implemented as FET M6, M8 and M10. In a read operation, a voltage on a wordline corresponding to a selected non-volatile memory device 206, 208 or 210 may be raised to close a corresponding FET M6, M8 or M10. Closing the corresponding FET connects the second terminal of the selected non-volatile memory device to a reference node (e.g., a ground node).

In this context, a "conducting element" comprises a circuit element capable of permitting current to pass between two nodes. In a particular implementation, a conducting element may vary a current permitted to pass between nodes based, at least in part, on a particular condition. The particular implementations described herein employ FETs as conducting elements to permit current to pass between source and drain terminals based, at least in part, on a voltage applied to a gate terminal. It should be understood, however, that these are merely examples of conducting elements in the description and drawings provided for illustration, and that other types of devices such as, a bipolar transistor, diode, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

In this context, a "bitline" comprises a conductor that is connectable to at least one terminal of a memory element during a write operation to transmit a signal altering a memory state of the memory element, or during a read operation to transmit a signal indicative of a current memory state of the memory element. Also in this context, a "wordline" comprises a conductor for transmitting a signal to select a particular bitcell or group of bitcells, or a particular memory element or group of memory elements, to be accessed in a read operation or a write operation. In a particular example implementation, a voltage of a signal on a wordline may be raised or lowered to select or deselect a particular bitcell or group of bitcells, or a particular memory element or group of memory elements, to be connected to a corresponding bitline or group of bitlines, or a particular memory element or group of memory elements, during a read or write operation. It should be understood, however, that this is merely an example of a wordline and that claimed subject matter is not limited in this respect. Also, in this context, a "reference node" comprises a node in a circuit that is maintained at a particular voltage level or at a particular voltage difference from another node in the circuit. In one example, a reference node may comprise or be connected to a ground node (e.g., at 0.0V relative to a supply voltage). In other particular implementations, a reference node may be maintained at a particular voltage relative to that of a ground node.

In a read operation, a sense amplifier 220 may detect a current state of a selected non-volatile memory device 206, 208 or 210 in a read operation based, at least in part, on a voltage applied to a gate of inverter 212. Here, the voltage on bitline BL may be a function of the particular impedance state of the selected non-volatile memory device. If the selected non-volatile memory device is in a low impedance or conductive state, a voltage on an output terminal of inverter may be raised to close FET M2 and complete a negative feedback pulling an input voltage to latch 214 lower. If the selected non-volatile memory device is in a high impedance or insulative state, a voltage on an output terminal of inverter 212 may be lowered raised to open FET M2 and raising an input voltage to latch 214. Latch 214 may generate a data value Q at an output terminal (e.g., as a "0" or "1" value). According to an embodiment, operating properties of FET M2 and inverter 212 may be tuned to account for variability in a mismatch of a selected non-volatile memory device (e.g., non-volatile memory element 206, 208 or 210) in a low impedance or conductive state.

Bitline BL is coupled to voltage source $V_{sense}$ through resistive elements 202 and 204. In a particular implementation in which non-volatile memory elements 206, 208 and 210 are formed as CES elements, resistive elements 202 and 204 may similarly be formed as CES elements in the same or similar process steps. Here, resistive elements 202 and 204 formed as CES elements may be formed or placed in a low impedance or conductive state. According to an embodiment, resistive elements 202 and 204 forming a load may prevent unintended reset of a selected non-volatile memory element in read operations. Assuming, for example, that resistive elements 202 and 204, and the selected non-volatile memory element in a low impedance or conductive state have the same resistance R, a voltage across terminals of the selected non-volatile memory element may be approximately $V_{sense}/3$ (which may be significantly lower than $V_{reset}$ to bring out an unintended reset operation). This voltage may be lowered (e.g., to $V_{sense}/3$), for example, if a combined load from resistive elements 202 and 204 is higher than R. Assuming insignificantly small current flowing to a gate of inverter 212, a current in the selected non-volatile memory element may be $V_{sense}/3R$ (e.g., significantly lower than a current $I_{reset}$ sufficient for a reset operation). It should be understood that in other implementations, a combined resistance of resistive elements 202 and 204 may be greater than or less than twice the resistance of the selected non-volatile memory element in a low impedance or conductive state. In one alternative implementation, the combined resistance of resistive elements 202 and 204 may be about the same as the resistance of the selected non-volatile memory element in a low impedance or conductive state. In another alternative implementation, the combined resistance of resistive elements 202 and 204 may be about three times the resistance of the selected non-volatile memory element in a low impedance or conductive state. It should be understood that these are merely examples of load that may be formed between a voltage source and a terminal of a selected non-volatile memory element, and claimed subject matter is not limited in this respect.

Also, in the particular implementation in which resistive elements 202 and 204 are formed as CES elements born on in a low impedance or conductive state, the particular series coupling of resistive elements 202 and 204 may provide for robust operation in two ways. Firstly, if a selected memory elements 206, 208 or 210 is in a high-impedance state, then the series connected resistive elements (202 and 204) may act as a compliance current limiting circuit, thus preventing spurious state-transition to the conductive state in the selected memory element. Secondly, as more current is demanded, the series connected CES elements may introduce an additional voltage across thereby preventing a build-up of voltage bias across the selected memory element sufficient for a set operation. Alternatively, if a selected memory element (206, 208 or 210) is in a conductive state, then the series connected elements may form a resistive ladder circuit with the selected memory element. Thus, a voltage bias across any CES element in a series of CES elements may be reduced such that none of the CES elements in the series experience a voltage bias that is in excess of a RESET potential. Furthermore, a current limiting property of the series connection may also prevent a build-up of current sufficient for a reset operation, thereby protecting against a spurious state-transition into a high-impedance state. As can be observed by someone skilled in the art, there can be multiple such elements in series. The number of CES elements acting as a series-connected load provides a trade-off between robustness of operation versus sensing speed. According to an embodiment, robustness against spurious state-transition may increase as a number of series elements. An increased number of series elements, on the other hand, may decrease read-current, thereby leading to slower sensing speeds.

Figure 3A:
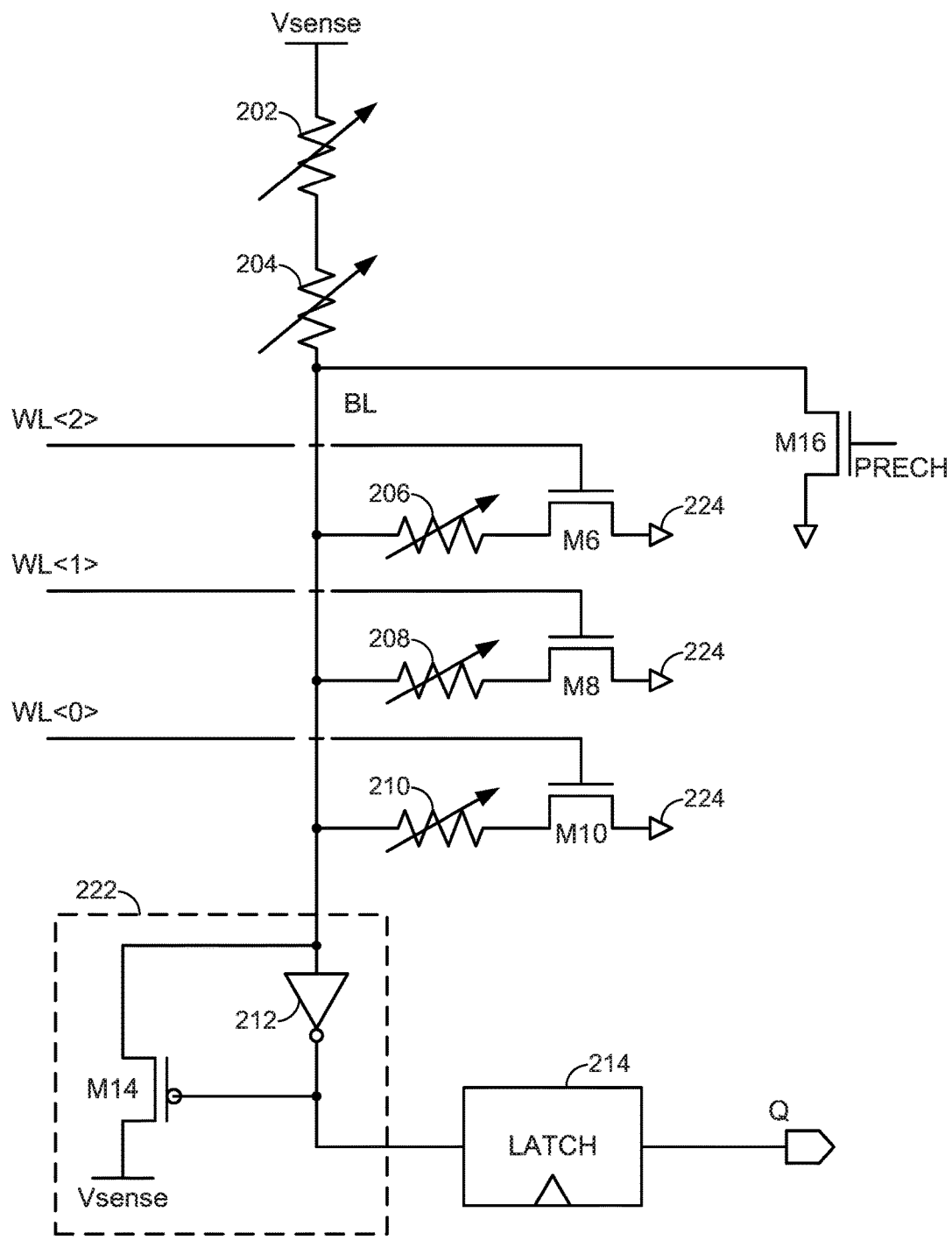
FIG. 3A is schematic diagram of a circuit for applying read operations to a non-volatile memory element according to an alternative embodiment.

FIG. 3A shows an alternative embodiment in which the circuit of FIG. 2 is modified by including FET M16 to pre-charge bitline BL in a read operation. Here, Bitline BL may be pre-discharged to 0.0V at the beginning of a read operation. Additionally, FET M2 is replaced by a PFET M14 such that if the selected non-volatile memory device is in a high impedance or insulative state, a voltage on an output terminal of inverter 212 may be lowered to close PFET M14 and raising an input voltage to latch 214. If a selected non-volatile memory device is in a low impedance or conductive state, a voltage on an output terminal of inverter may be raised to open FET M14 and complete a negative feedback pulling an input voltage to latch 214 lower.

Figure 3B:
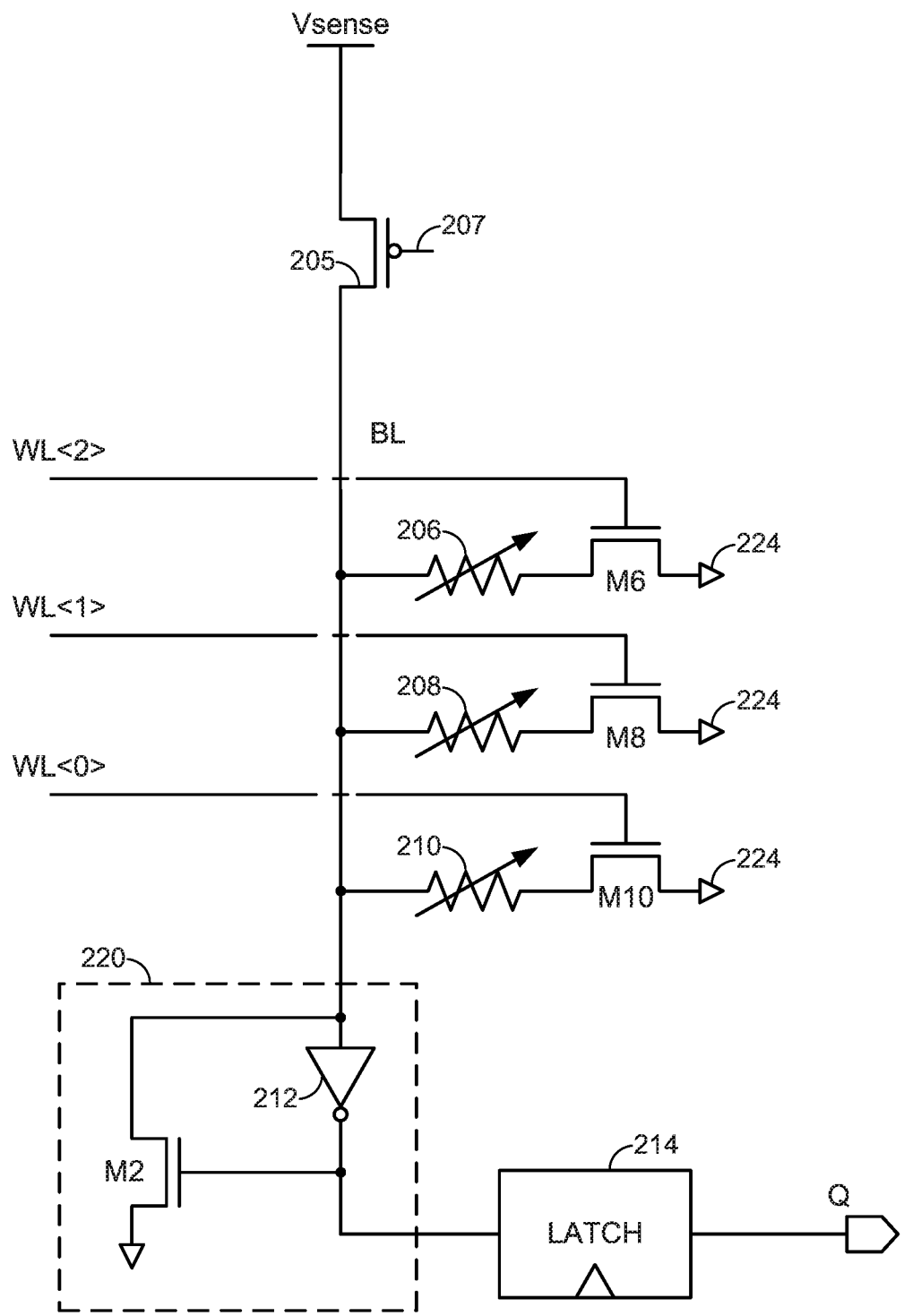
FIG. 3B is schematic diagram of a circuit for applying read operations to a non-volatile memory element according to an alternative embodiment.

FIG. 3B is another alternative embodiment in which the circuit of FIG. 2 is modified by replacing the load of resistive elements 202 and 204 with a PFET 205 having a tunable impedance in response to an analog signal 207 applied to a gate. Here, analog signal 207 may be externally generated to tailor a load to achieve desired performance.

Figure 4A:
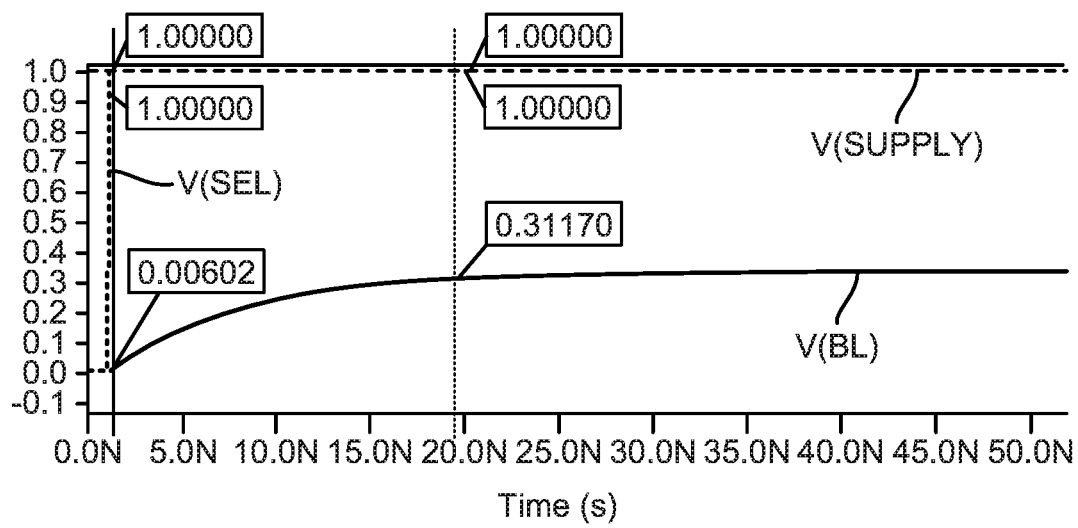
FIGS. 4A and 4B are plots illustrating advantages of particular implementations.
Figure 4B:
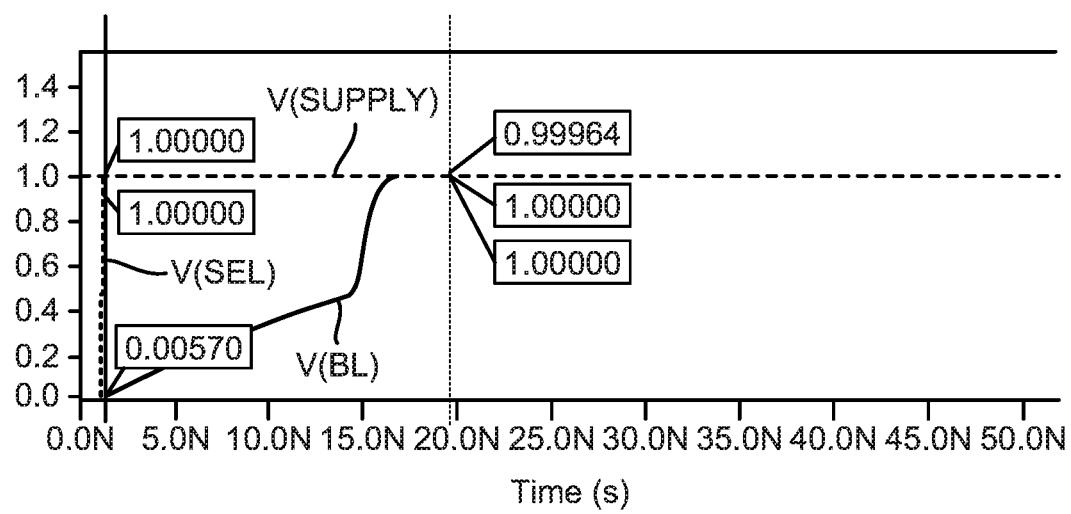

FIGS. 4A and 4B are plots illustrating advantages of particular implementations of the circuits shown in FIGS. 2, 3A and 3B discussed above. FIG. 4A shows results of a simulation when a sensed non-volatile memory device (e.g., non-volatile memory device 206, 208 or 210) is in a conductive or low impedance state. Here, an intermediate voltage may rise only up to $V_{sense}/3$ or 0.3V. This provides an improved read-robustness margin due to $V_{reset}$ variations.

In FIG. 4B, a voltage across terminals of a non-volatile memory device being sensed (e.g., non-volatile memory device 206, 208 or 210) may approach a sense voltage at 1.0V. However, a current through the sensed non-volatile memory device may barely approach 100 nA. This may be significantly lower than a compliance current to transition to the sensed non-volatile memory element to a high impedance or insulative state.

Figure 5A:
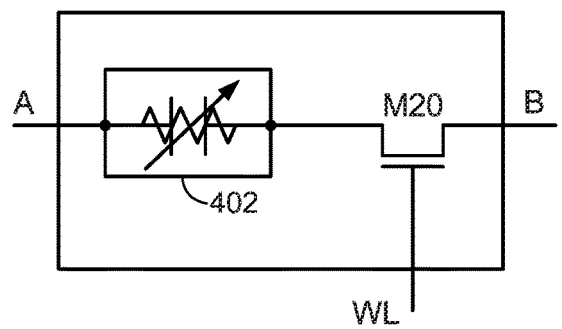
FIG. 5A is schematic diagram of a circuit for applying a read operation to a non-volatile memory element according to an embodiment.

In another embodiment, FIG. 5A is schematic diagram of a circuit for applying a read operation to a non-volatile memory element according to an embodiment. A bitcell comprises a non-volatile memory element 402 that may be coupled to a precharged bitline in a read operation. In a particular implementation, non-volatile memory element 402 may be formed as a CES element or CeRAM element as described above. It should be understood, however, that a CES or CeRAM element is merely an example of a device that may be used to form a non-volatile memory element, and claimed subject matter is not limited in this respect. FET M20 may then be closed to connect a first terminal of non-volatile memory element 602 to a node B (e.g., a reference node). A current state of non-volatile memory element 402 may be detected based, at least in part on a signal at a node A on a second terminal of non-volatile memory element 402. For example, as shown in FIG. 5C, a signal at node A on the second terminal of non-volatile memory element 402 may be compared with a reference signal Ref at a sense amplifier 404. A current state of non-volatile memory 402 may be detected based, at least in part, on an output signal of sense amplifier 404. According to an embodiment, sense amplifier 404 may comprise a differential amplifier formed using circuitry and techniques known to those of ordinary skill in the art to impart a linear or non-linear gain on an output signal based on a difference between voltages at input terminals.

Figure 5B:
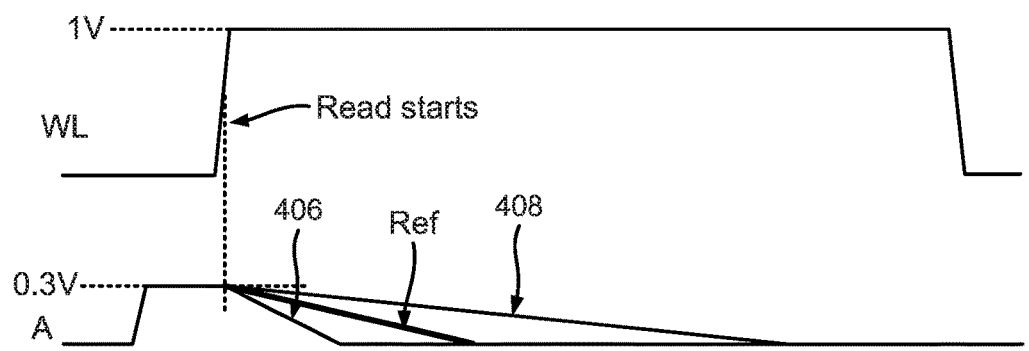
FIG. 5B is a timing diagram of a read operation according to an embodiment.
Figure 5C:
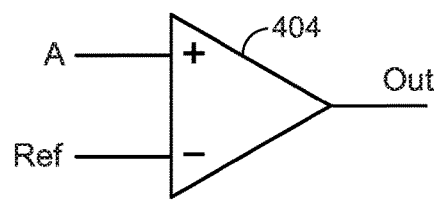
FIG. 5C is a schematic diagram of a portion of a detection circuit according to an embodiment.

FIG. 5B is a timing diagram of a read operation performed in connection with non-volatile memory element 402 according to an embodiment. As shown, the bitline may be precharged at terminal to a particular voltage (e.g., to 0.3V as shown). Following precharge of the bitline, a voltage on wordline WL may be raised to close FET M20, connecting non-volatile memory element 402 to node B. In particular implementations, node B may be connected to VSS directly or coupled to VSS through a current controlling NMOS device, for example. Portion 406 of the voltage at node A may be a profile indicative of a voltage at node A responsive to non-volatile memory element 402 being in the low impedance or conductive state while portion 408 may be a profile indicative of a voltage at node A responsive to CES element being in the high impedance or insulative state. As may be observed, voltages expressed by portions 406 and 408 may decay over time as a capacitance charged during the precharge operation discharges over time.

Portion Ref shown in the bottom plot of FIG. 5B may similarly decay over time. According to an embodiment, an output signal of sense amplifier 404 may be integrated over time to provide a value indicative of a current state of CEM (e.g., a positive integration result indicating that non-volatile memory 402 is in a high impedance or insulative state and a negative integration result indicating that non-volatile memory element 402 is in a low impedance or conductive state).

According to an embodiment, to avoid an unintended reset event in a read operation to determine an impedance state of non-volatile memory element 402 sense amplifier 404 may be designed to operate at a very low voltage domain (e.g., to maintain a voltage across terminals of CES 402 below $V_{reset}$). Operating at such low voltage domain, however, may entail complex circuitry in order to maintain a sufficient signal-to-noise for reliable detection of an impedance state during a read operation.

According to an embodiment, a sense amplifier for detecting an impedance state of a non-volatile memory device may be configured to operate a voltage domain higher than a voltage domain of the non-volatile memory device. As described below, portions of a bitline separated by a capacitance may be precharged to different voltage in read operation. This may enable use of simpler sense amplifier designs capable of operating at a voltage domain that is higher than the voltage domain of the non-volatile memory device while avoiding unintended reset operations.

FIG. 6A is a schematic diagram in which a reference voltage Ref1 may be generated based on a resistive element $R_{mid}$ for use in detecting a state of a selected non-volatile memory element such as non-volatile memory element 502 or non-volatile memory element 504. In a particular implementation, non-volatile memory elements 502 or 504 may be formed as CES elements or CeRAM elements as described above. It should be understood, however, that a CES or CeRAM element is merely an example of a device that may be used to form a non-volatile memory element, and that claimed subject matter is not limited in this respect. In a read operation, a node A2 on a terminal of non-volatile memory element 502 or a node A4 on a terminal of non-volatile memory element 504 may be switchably coupled to input terminal A1 of sense amplifier 508 by a switch S1 or S2. Switches S1 and S2 may be formed from any one of several different conducting elements such as NFET or PFET devices. In an example, switch S1 may be closed and switch S2 may be opened in a read operation to detect a current state of non-volatile memory element 502. Similarly, switch S1 may be opened and switch S2 may be closed in a read operation to detect a current state of non-volatile memory element 504.

Node A2 or node A4 on a terminal of a selected non-volatile memory element 502 or 504 is coupled to a first input terminal A1 of sense amplifier 508 through a capacitance Cc. Similarly, a node A6 on a terminal of resistive element $R_{mid}$ is coupled to a second terminal Ref1 of sense amplifier 508 to provide a reference voltage Ref1. According to an embodiment, different portions of a bitline including node A2 or A4 on a terminal of a selected on-volatile memory element (non-volatile memory element 502 or 504) are separated by a capacitance Cc and are precharged to different voltages for a read operation. A first portion including node A2 or A4 connected to a terminal of the selected non-volatile memory element may be precharged to 0.3V by closing FET M52 responsive to a lower voltage on wordline WL. A second portion connected to input terminal A1 of sense amplifier 508 may be precharged to 1.0V by closing FET M50 responsive to a lower voltage on wordline WL. Similarly, different portions of a bitline coupling node A6 of a terminal of resistive element $R_{mid}$ to input terminal Ref1 of sense amplifier 508 separated by a capacitance Cc are precharged to different voltages for a read operation. Node A6 on a terminal of resistive element $R_{mid}$ may be precharged to 0.3V by closing M62 responsive to a lower voltage on wordline WL. A second portion connected to input terminal REF1 of sense amplifier may be precharged to 1.0V by closing FET M60 responsive to a lower voltage on wordline WL.

According to an embodiment, a capacitance Cc may be greater than a negligible capacitance compared with an intrinsic capacitance at node A1 and terminal REF1 (e.g., on the order of 5.0 to 10.0 fF). Capacitance Cc may be formed a any one of several devices such as, for example, an MIM capacitor, or a metal oxide semiconductor (MOS) coupled capacitor. Intrinsic capacitances at particular nodes such as A0 and Ref0 may depend on any one of several factors such as a number of rows on a bitline.

According to an embodiment, a signal generated by $R_{mid}$ may be configured to generated reference voltage Ref1 to be roughly between a first voltage generated on terminal A1 by a selected non-volatile memory element in a conductive or low-impedance state and a second voltage generated on terminal A1 by the selected non-volatile memory element in an insulative or high-impedance state.

FIG. 6B is a timing diagram of a read operation according to an embodiment of the circuit shown in FIG. 6A. As shown, a voltage of wordline WL remains low during a precharge period to precharge a portion of a bitline connected to input terminal A1 to 1.0V and precharge a portion of the bitline connected to a node A2 or A4 on a terminal of a selected non-volatile memory element (e.g., non-volatile memory element 502 or 504) to 0.3V. As the voltage of wordline WL is raised to connect the selected non-volatile memory element to a reference node, a voltage at node A0 begins to decrease as the charged capacitance Cc discharges through node B2 or B4. In response, a voltage on an input terminal A1 to sense amplifier may similarly decay. However, as discussed above the voltage on input terminal A1 may decay at different rates depending on whether the selected non-volatile memory element is in high impedance or insulative state, or in a low impedance or conductive state. For example, if the selected non-volatile memory element is in a high impedance or insulative state, the voltage at node A1 may decay according to a profile depicted in portion 518. If the selected non-volatile memory element is in a low impedance or conductive state, the voltage at input terminal A1 may decay according to a profile depicted in portion 520. A voltage at node Ref0 at a second input terminal to sense amplifier 508 may decay according to a profile depicted by a portion marked Ref1. An output signal of sense amplifier 508 may provide a signal representing a difference between the voltage at input terminal Ref1 and the voltage at input terminal A1, which may be integrated to provide a positive value indicating that the selected non-volatile memory element is in a high impedance or conductive state, or provide a negative value indicating that the selected Non-volatile memory element is in a low impedance or conductive state Precharging terminals Ref1 and A1 may enable sense amplifier to detect small voltage differentials between these terminals. While the particular illustrated embodiment, shows that terminals Ref1 and A1 are precharged to 1.0V, terminals Ref1 and A1 may be precharged to a different particular common voltage so as to enable detection of a small voltage difference at sense amplifier 508.

Figure 7:
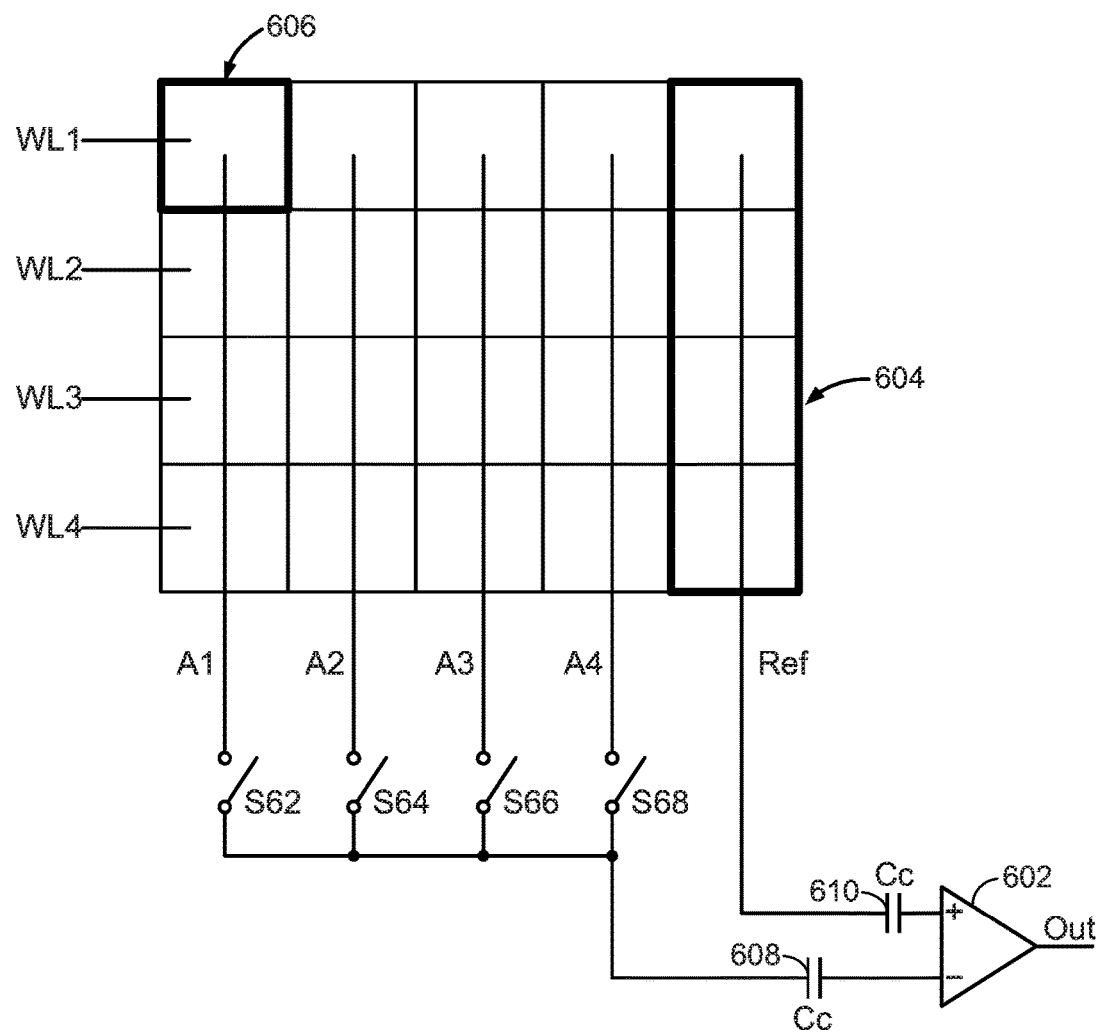
FIG. 7 is a schematic diagram of a circuit for applying a read operation to a non-volatile memory element according to an alternative embodiment.

FIG. 7 is a schematic diagram of a circuit for applying a read operation to a non-volatile memory element according to a particular implementation of an array of non-volatile memory elements. A voltage on a wordline WL1, WL2, WL3 or WL4 may be raised or lowered to select bitcells in a read operation. A particular bitcell within the selected wordline may be selected by closing a corresponding switch S62, S64, S66 or S68 to couple a non-volatile memory element of the selected bitcell to a first input terminal of sense amplifier 602 through a capacitance Cc. A reference resistance or impedance may be similarly computed to a second input terminal of sense amplifier 602 through a capacitance Cc. In a read operation, nodes at the input terminals of sense amplifier 602 may be precharged to a first voltage while nodes 608 and 610 may be precharged to a second voltage having a magnitude greater than a magnitude of the first voltage as discussed above in connection with FIGS. 6A and 6B. A current state of the non-volatile memory element of the selected bitcell may then be detected by integrating an output signal of sense amplifier 602 as discussed above.

Figure 8A:
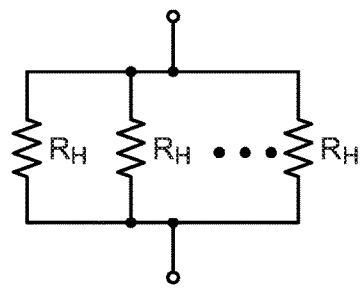
FIGS. 8A through 8F are schematic diagrams of alternative circuits forming a resistance for use in generating a reference signal according to an embodiment.
Figure 8B:
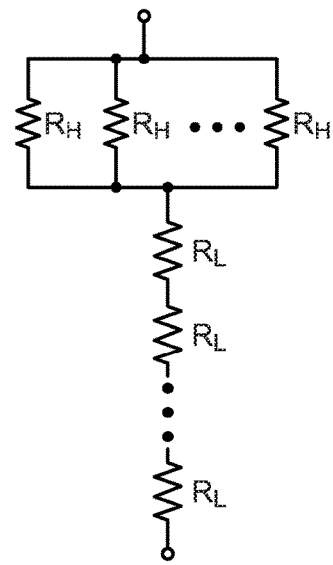
Figure 8C:
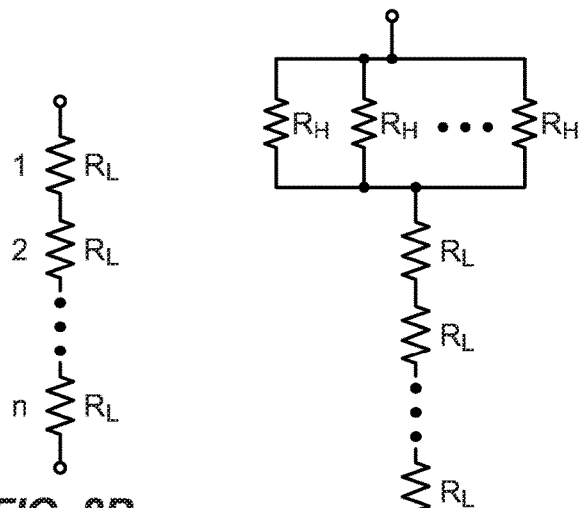
Figure 8D:
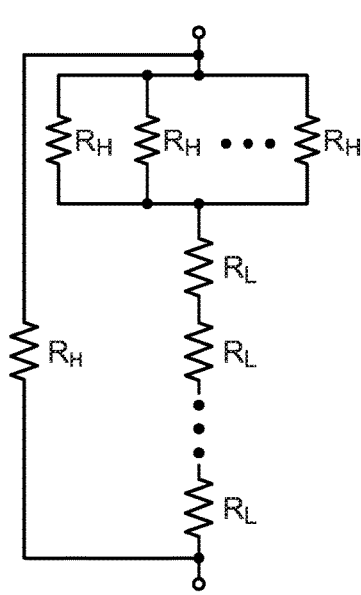
Figure 8E:
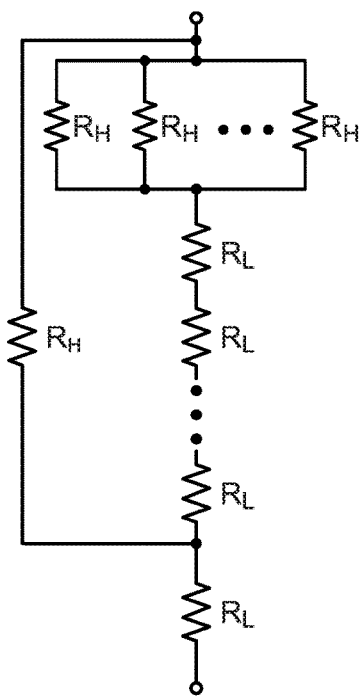
Figure 8F:
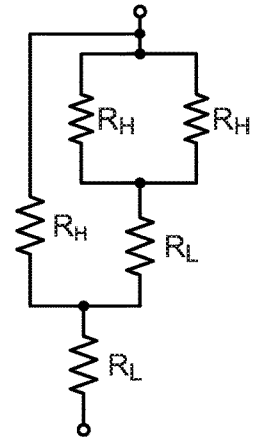

The particular example implementation of FIG. 6A shows generation of a reference signal to be provided to an input terminal of sense amplifier using a device $R_{mid}$ that provides an impedance state that is roughly between possible low (conductive) and high (insulative) impedance states of non-volatile memory elements 502 and 504. In one implementation, element $R_{mid}$ may be formed from a combination of CES elements born on in either a high impedance or insulative state, or a low impedance or conductive state. Example topologies for implementation of $R_{mid}$ are shown in FIGS. 8A through 8F wherein $R_L$ denotes a CES element placed in a low impedance or conductive state and $R_H$ denotes a CES element placed in a high impedance or insulative state. In FIG. 8A, a resulting resistance $R_{mid}=R_H/n$. In FIG. 8B, a resulting resistance may provide $R_{mid}=R_L*n$. In FIG. 8C, a resulting resistance may provide $R_{mid}=n_1*R_L+R_H/n_2$, where $n_1$ is a count of $R_L$ elements and $n_2$ is a count of $R_H$ elements. In FIG. 8D, a resulting resistance may provide $R_{mid}=R_H \| (R_H/n_2+R_L*n_1)$, where $n_2$ is a number of $R_H$ elements that are coupled in parallel and $n_2$ is a number $R_L$ elements coupled in series. In FIG. 8E, a resulting resistance may provide $R_{mid}=[R_H\|(R_H/2+2*R_L)]+R_L$. In FIG. 8F, a resulting resistance may provide $R_{mid}=[R_H\|(R_H/2+R_L)]+R_L$. It should be understood, however, that these are merely example topologies to impart a reference impedance or resistance for example implementations, and that claimed subject matter is not limited in this respect.

In particular embodiments, such as those previously described herein, plurality of CEM devices may be formed to bring about integrated circuit devices, which may include, for example, a first correlated electron device having a first CEM and a second correlated electron device having a second correlated electron material, wherein the first and second CEMs may comprise substantially dissimilar impedance characteristics. Also, in an embodiment, a first CEM device and a second CEM device, may be formed within a particular layer of an integrated circuit. Further, in an embodiment, forming the first and second CEM devices within a particular layer of an integrated circuit may include forming the CEM devices at least in part by selective epitaxial deposition. In another embodiment, the first and second CEM devices within a particular layer of the integrated circuit may be formed at least in part by ion implantation, such as to alter impedance characteristics for the first and/or second CEM devices, for example.

Also, in an embodiment, two or more CEM devices may be formed within a particular layer of an integrated circuit at least in part by atomic layer deposition of a CEM. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacently to first and second CEM devices, respectively.

In a further embodiment, one or more of a plurality of CEM devices may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment. In a further embodiment, CEM devices may be formed in devices in combination with conducting elements as described herein formed by the same or different processes. In an example implementation, CEM devices may be formed in combination with conducting elements using a different and/or complementary process technologies such as complementary metal oxide semiconductor (CMOS) technologies.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A device comprising:
   one or more non-volatile memory elements, at least one of the one or more non-volatile memory elements comprising a first terminal coupled to a bitline and a second terminal coupled to a node;
   a sense voltage source coupled to the first terminal through a load; and
   a circuit coupled to the first terminal through the bitline to detect an impedance state of the at least one of the one or more non-volatile memory elements as either a low impedance or conductive state, or a high impedance or insulative state based, at least in part, on a signal on the bitline,
   wherein the load comprises an impedance that is at least as large as an impedance between the first and second terminals of the at least one of the one or more non-volatile memory elements while the at least one of the one or more non-volatile memory elements is in the low impedance or conductive state.

2. The device of claim 1, wherein the second terminal is coupled to the node through a conducting element that is configured to connect the second terminal to the node responsive to a signal on a wordline.

3. The device of claim 1, wherein the load comprises one or more devices formed from correlated electron material.

4. The device of claim 1, wherein the load comprises one or more correlated electron switches (CESs) connected in series.

5. The device of claim 1, wherein the load comprises at least a load across source and drain terminals of a field effect transistor.

6. The device of claim 4, wherein the one or more CESs are maintained in a conductive or low impedance state.

7. The device of claim 1, wherein the at least one of the one or more nonvolatile memory elements is capable of being placed in a high impedance or insulative state, or a low impedance or conductive state.

8. The device of claim 7, wherein the load comprises a resistance that is greater than a resistance of the at least one of the one or more non-volatile memory elements.

9. The device of claim 1, wherein the circuit coupled to the first terminal through the bitline is configured to detect the impedance state based, at least in part, on a voltage of the bitline.

10. The device of claim 9, and further comprising a conducting element to selectively couple the bitline to the node based, at least in part, on the impedance state.

11. A method comprising:
    coupling a first terminal of a non-volatile memory element to a node on a bitline, the node on the bitline being coupled to a voltage source through a load, a second terminal of the non-volatile memory element being coupled to a reference node; and
    detecting an impedance state of the non-volatile memory element as either a low impedance or conductive state, or a high impedance or insulative state based, at least in part, on a voltage at the node on the bitline,
    wherein the load comprises an impedance that is at least as large as an impedance between the first and second terminals of the non-volatile memory element while the non-volatile memory element is in the low impedance or conductive state.

12. The method of claim 11, wherein the non-volatile memory element is selected from a plurality of non-volatile memory elements at least in part in response to a voltage on a wordline.

13. The device of claim 1, wherein the load comprises one or more devices formed from material substantially the same as material formed between the first and second terminals of the at least one of the one or more non-volatile memory elements.

14. The device of claim 1, wherein the at least one of the one or more non-volatile memory elements comprises a correlated electron switch (CES) comprising a correlated electron material (CEM) formed between the first and second terminals of the at least one of the one or more non-volatile memory elements, and wherein the load comprises one or more devices comprising the CEM formed between the sense voltage source and the bitline.

* * * * *